US010050159B2

(12) United States Patent
Chen et al.

(10) Patent No.: US 10,050,159 B2
(45) Date of Patent: Aug. 14, 2018

(54) LENS STRUCTURE

(71) Applicant: TAIWAN SEMICONDUCTOR MANUFACTURING CO., LTD., Hsinchu (TW)

(72) Inventors: Chien-Chih Chen, Hsinchu (TW); Su-Yu Yeh, Hsinchu (TW); Tzu-Shin Chen, Tainan (TW); Mu-Han Cheng, Tainan (TW); Chun-Hai Huang, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/375,253

(22) Filed: Dec. 12, 2016

(65) Prior Publication Data

US 2018/0166594 A1 Jun. 14, 2018

(51) Int. Cl.

| | |
|---|---|
| ***H01L 31/0232*** | (2014.01) |
| ***G02B 3/00*** | (2006.01) |
| ***G02B 5/20*** | (2006.01) |
| ***H01L 27/146*** | (2006.01) |
| ***H01L 31/0352*** | (2006.01) |

(52) U.S. Cl.

CPC ...... *H01L 31/02327* (2013.01); *G02B 3/0068* (2013.01); *G02B 5/201* (2013.01); *H01L 27/14643* (2013.01); *H01L 31/035281* (2013.01)

(58) Field of Classification Search

CPC .. H01L 27/14643–27/14663; H01L 27/14689; H01L 27/146–27/14893; H01L 27/14618; H01L 31/02327; H01L 31/035281; H01L 27/14625–27/14629; G02B 3/0068; G02B 5/201

See application file for complete search history.

(56) References Cited

U.S. PATENT DOCUMENTS 9,130,072 B1 * 9/2015 Chen .................. H01L 27/1464
2006/0146415 A1 * 7/2006 Kim .................. H01L 27/14621 359/642
2006/0191865 A1 * 8/2006 Nishimura ........ H01L 21/31055 216/58
2007/0164193 A1 * 7/2007 Lee .................... H01L 27/1462 250/200
2008/0099804 A1 * 5/2008 Venezia ........... H01L 27/14625 257/291
2012/0086093 A1 * 4/2012 Otsuka ............. H01L 27/14621 257/432

* cited by examiner

*Primary Examiner* — Tucker J Wright
(74) *Attorney, Agent, or Firm* — McClure, Qualey & Rodack, LLP

(57) ABSTRACT

A semiconductor device and a method for fabricating the semiconductor device are provided. In the method for fabricating the semiconductor device, at first, a dielectric layer is provided. Then, trenches are formed in the dielectric layer. Thereafter, the trenches are filled with spacer material to form a spacer structure in the dielectric layer for defining pixel regions. Then, lens structures are formed on the pixel regions. Each of the lens structures includes a first curved lens layer, a second curved lens layer and a curved color filter layer. The curved color filter layer is disposed on the second curved lens layer or between the first curved lens layer and the second curved lens layer.

20 Claims, 19 Drawing Sheets

1730
132
136
1734
1720
110

LENS STRUCTURE

BACKGROUND

In semiconductor technology, image sensors are used for sensing light emitted towards them to form an image. For converting various photo energy of the light into electrical signals, the image sensor includes pixels having photosensitive diodes, reset transistors, source follower transistors, pinned layer photodiodes, and/or transfer transistors. In general, the image sensor may be a complementary metal-oxide-semiconductor (CMOS) image sensor (CIS), an active-pixel sensor (APS), a passive-pixel sensor and a charged-coupled device (CCD) sensor. The above image sensor is widely used in various applications such as digital camera or mobile phone camera devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
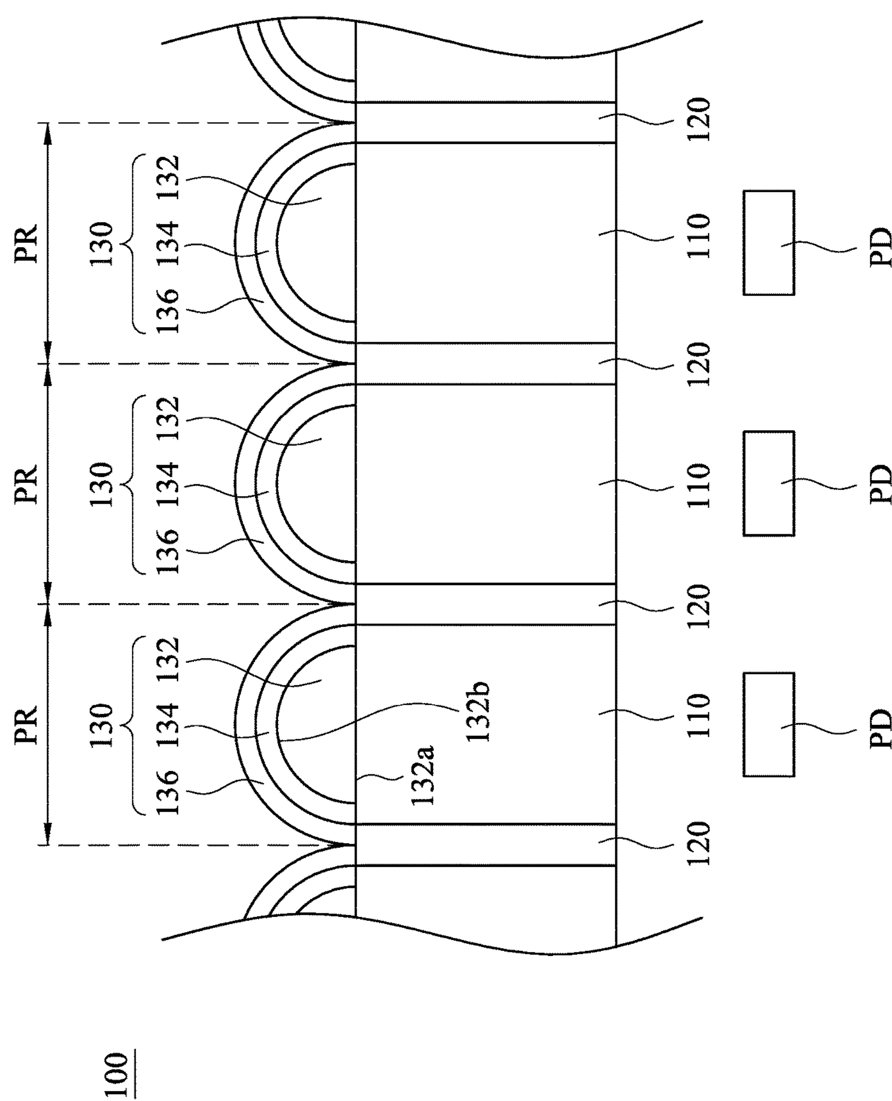
FIG. 1 is a schematic diagram showing a structure of a semiconductor device in accordance with an embodiment of the present disclosure.
Figure 2:
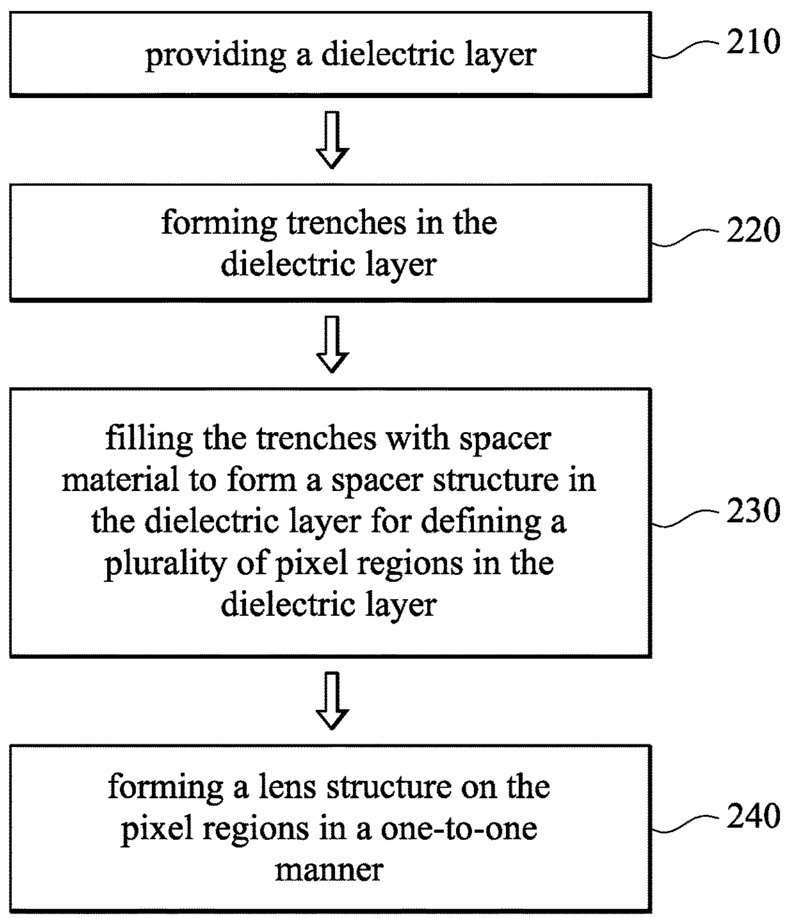
FIG. 2 is a flow chart showing a method for fabricating the semiconductor device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Terms used herein are only used to describe the specific embodiments, which are not used to limit the claims appended herewith. For example, unless limited otherwise, the term "one" or "the" of the single form may also represent the plural form. The terms such as "first" and "second" are used for describing various devices, areas and layers, etc., though such terms are only used for distinguishing one device, one area or one layer from another device, another area or another layer. Therefore, the first area can also be referred to as the second area without departing from the spirit of the claimed subject matter, and the others are deduced by analogy. In addition, the present disclosure may repeat reference numerals and/or letters in the various examples. This repetition is for the purpose of simplicity and clarity and does not in itself dictate a relationship between the various embodiments and/or configurations discussed. As used herein, the term "and/or" includes any and all combinations of one or more of the associated listed items.

Embodiments of the present disclosure are directed to a lens structure configured to enable light to be focused on a photodiode and a method for fabricating the lens structure. The lens structure includes a first curved lens layer, a second curved lens layer and a curved color filter layer. The light to be focused enters the first curved lens layer from an upper surface of the first curved lens layer and exit from a lower surface of the first curved lens layer. The second curved lens layer is disposed on the upper surface of the first curved lens layer. The curved color filter layer is disposed on the second curved lens layer or between the first curved lens layer and the second curved lens layer. Since the curved color filter layer is formed in the lens structure, the curved color filter layer can be designed to have a small thickness, and an image sensor using the lens structure may have increased quantum efficiency.

Referring to FIG. 1. FIG. 1 is a schematic diagram showing a structure of a semiconductor device 100 in accordance with an embodiment of the present disclosure. The semiconductor device 100 includes a dielectric layer 110, a spacer structure 120 and lens structures 130. The spacer structure 120 is disposed in the dielectric layer 110 to define pixel regions PR in the dielectric layer 110 and the lens structures 130 are disposed on the pixel regions PR in a one-to-one manner. The spacer structure 120 is a grid to divide the dielectric layer 110 into the pixel regions PR. In this embodiment, each of the pixel regions PR is in a rectangular shape, and corresponds to one photodiode PD, but embodiments of the present disclosure are not limited thereto.

The lens structures 130 are configured to focus light on photodiodes PD, and thus the photodiodes PD convert photons of the light into electrons to generate a sensed image. The lens structures 130 includes a first curved lens layer 132, a color filter layer 134 and a second curved lens layer 136. The second curved lens layer 136 is disposed on the first curved lens layer 132, and the curved color filter layer 134 is disposed between the first curved lens layer 132 and the second curved lens layer 136. In this embodiment, the curved color filter layer 134 can be a red color filter, a blue color filter or a green color filter, but embodiments of the present disclosure are not limited thereto.

Since the curved color filter layer 134 and the second curved lens layer 136 are disposed on the first curved lens layer 132, the curved color filter layer 134 and the second curved lens layer 136 conform to a surface of the first curved lens layer 132. For example, the first curved lens layer 132 has a lower surface 132*a* and an upper surface 132*b*. The lower surface 132*a* contacts the dielectric layer 110, and the curved color filter layer 134 and the second curved lens layer 136 are disposed on the upper surface 132*b* of the first curved lens layer 132. In this embodiment, the first curved lens layer 132 is in a semi-circular shape, and thus the curved color filter layer 134 and the second curved lens layer 136 are in an arc shape. In some embodiments, the first curved lens layer 132 is in a triangle shape, and thus the curved color filter layer 134 and the second curved lens layer 136 have in an inverse V shape. However, embodiments of the present disclosure are not limited to the above embodiments. For example, the first curved lens layer 132 can be in a rectangular shape.

The first curved lens layer 132, the curved color filter layer 134 and the second curved lens layer 136 are designed to have different refractive indexes to enable the light to be focused on the photodiode PD. The first curved lens layer 132 has a first refractive index(n1), the second curved lens layer 136 has a second refractive index(n2), and the curved color filter 134 has a third refractive index(n3), and n1>n3>n2. Therefore, when the light emitted to the lens structures 130, the light is sequentially refracted by the second curved lens layer 136, the curved color filter layer 134 and the first curved lens layer 132, thereby enabling the light to be focused on the photodiode PD. For example, when the light is refracted to the first curved lens layer 132 by the curved color filter layer 134 and the second curved lens layer 136, the light enters the first curved lens layer 132 from the upper surface 132*b* and exits from the lower surface 136*a*, thereby being focused on the photodiode PD under the first curved lens layer 132.

In this embodiment, the curved color filter layer 134 is included in the lens structure 130 and has thickness in a range from 0.01 to 0.5 micrometer (um), therefore quantum efficiency can be increased accordingly.

Referring to FIG. 2 and FIG. 3 to FIG. 6, FIG. 2 is a flow chart showing a fabrication method 200 for fabricating the semiconductor device 100 in accordance with some embodiments of the present disclosure, and FIG. 3 to FIG. 6 are schematic structure diagrams of intermediate stages showing the fabrication method 200 of the semiconductor device 100 in accordance with some embodiments of the present disclosure.

Figure 3:
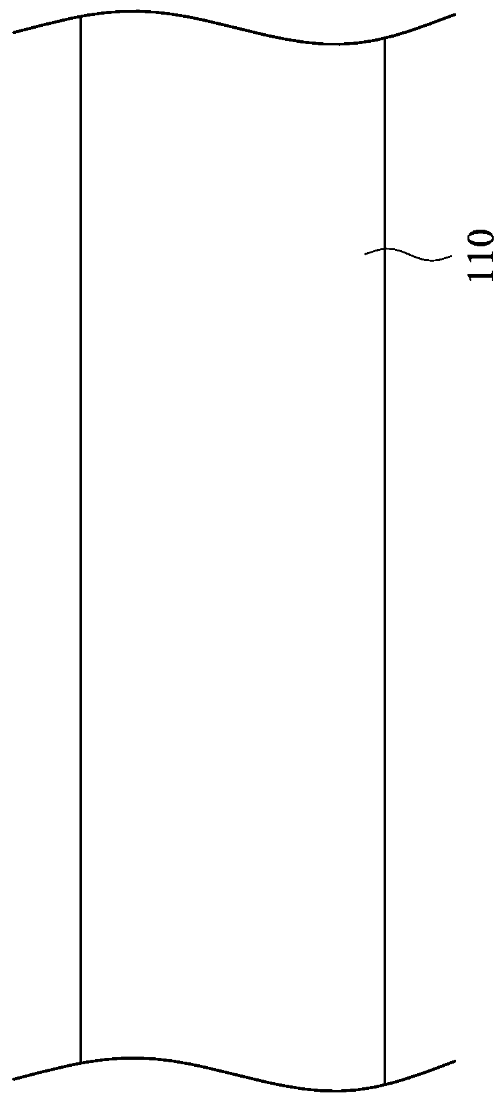
FIG. 3 to FIG. 6 are schematic structure diagrams of intermediate stages showing a method for fabricating the semiconductor device in accordance with some embodiments of the present disclosure
Figure 4:
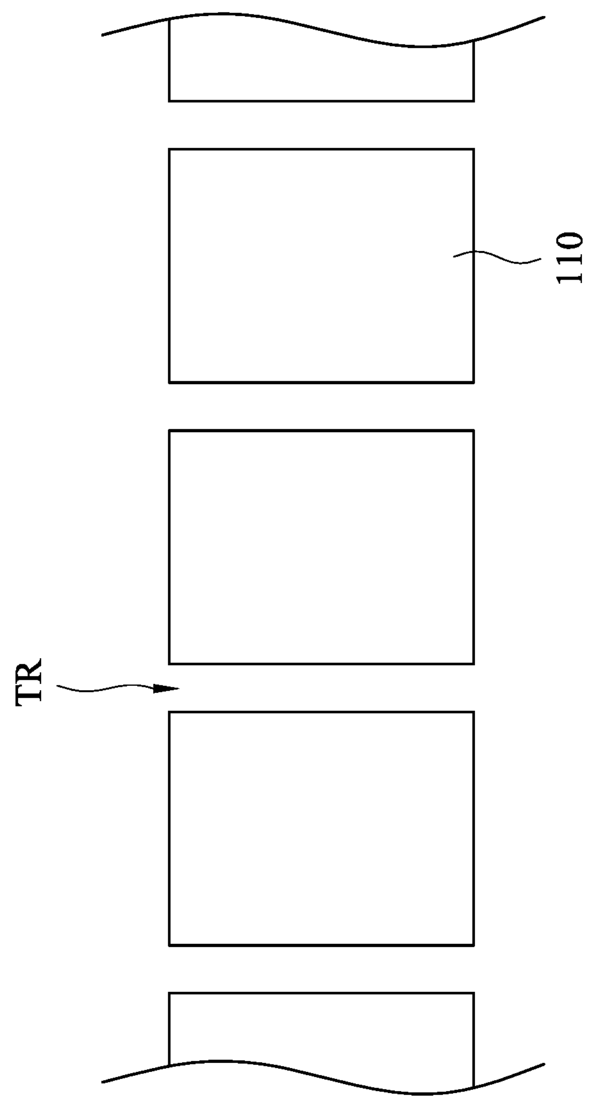

In the method 200, at first, operation 210 is performed to provide the dielectric layer 110 as show in FIG. 3. The dielectric layer 110 is a passivation layer such as silicon nitride or other suitable material, and can be formed by chemical vapor deposition (CVD), plasma enhanced CVD, sputter, and other methods known in the art. Then, operation 220 is performed to form trenches TR in the dielectric layer 110, as shown in FIG. 4. The trenches TR are in a shape of grid and can be formed by etching the dielectric layer 110. In this embodiment, the trenches TR divide the dielectric layer 110 into rectangular regions, but embodiments of the present disclosure are not limited thereto.

Figure 5:
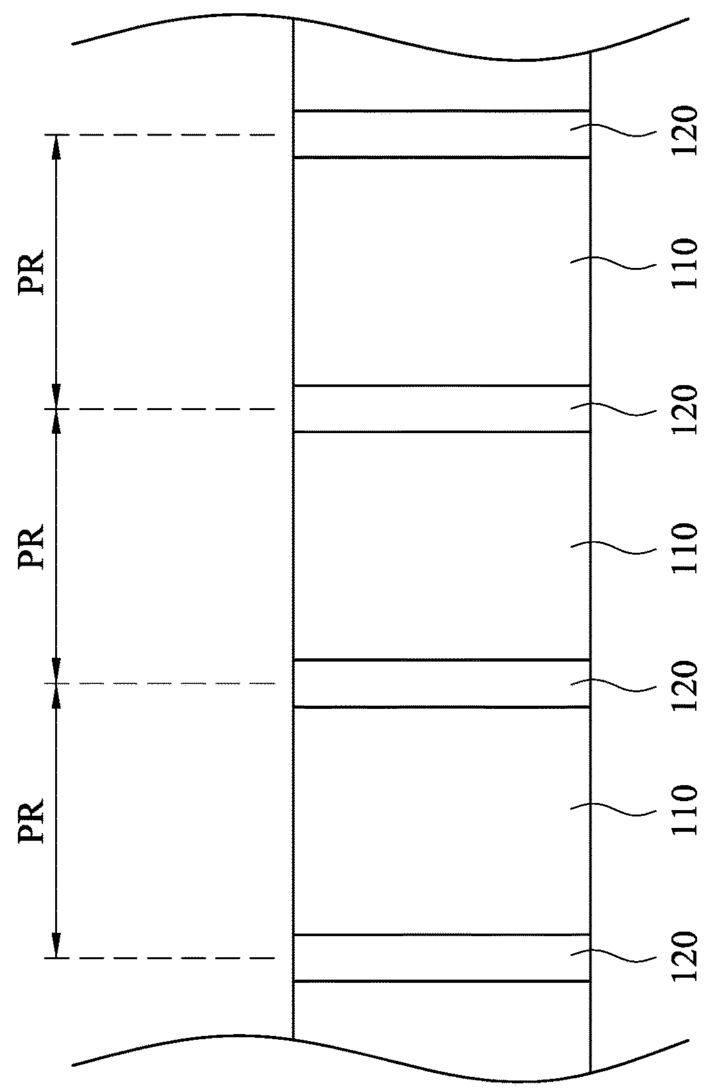

Thereafter, operation 230 is performed to fill the trenches TR with spacer material to form the spacer structure 120 in the dielectric layer 110 for defining the pixel regions PR in the dielectric layer 110, as shown in FIG. 5. In this embodiment, the spacer material is metal, and the operation 230 can be performed by a deposition process including chemical vapor deposition (CVD), sputter deposition, or other techniques known and used in the art for depositing conductive materials. In some embodiments, the spacer material is Tungsten.

Figure 6:
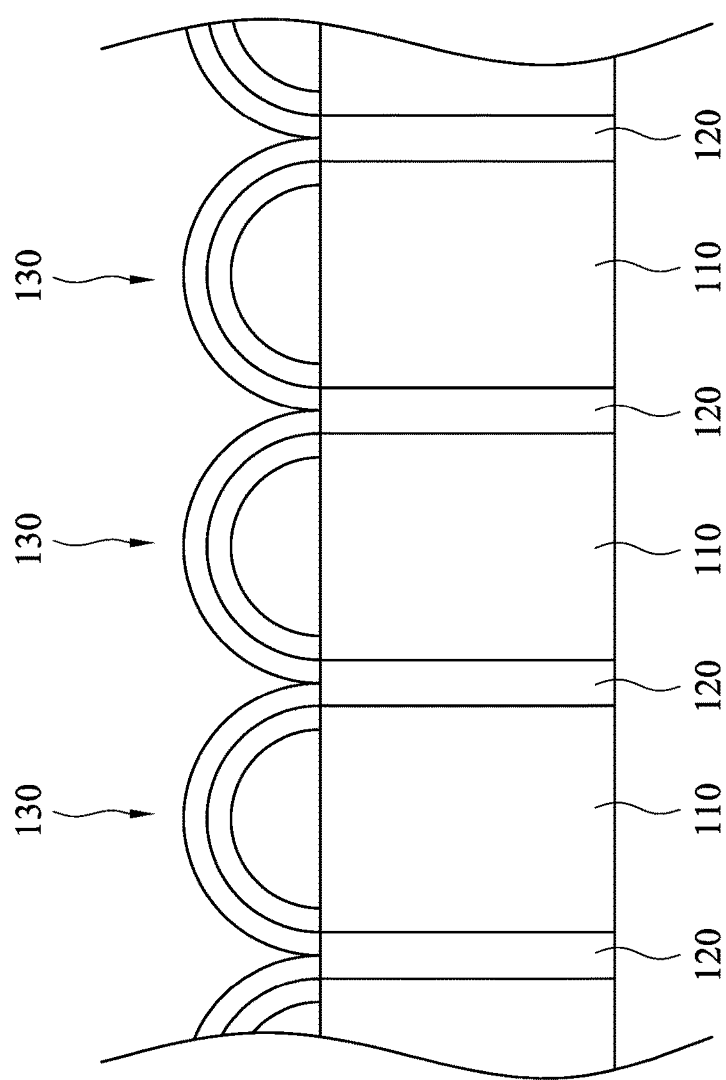

Then, operation 240 is performed form the lens structures 130 on the pixel regions PR in a one-to-one manner, as shown in FIG. 6. In this embodiments, the first curved lens layer 132 and the second curved lens layer 136 are made by silicon nitride or silicon oxide, but embodiments of the present disclosure are not limited thereto.

Figure 7:
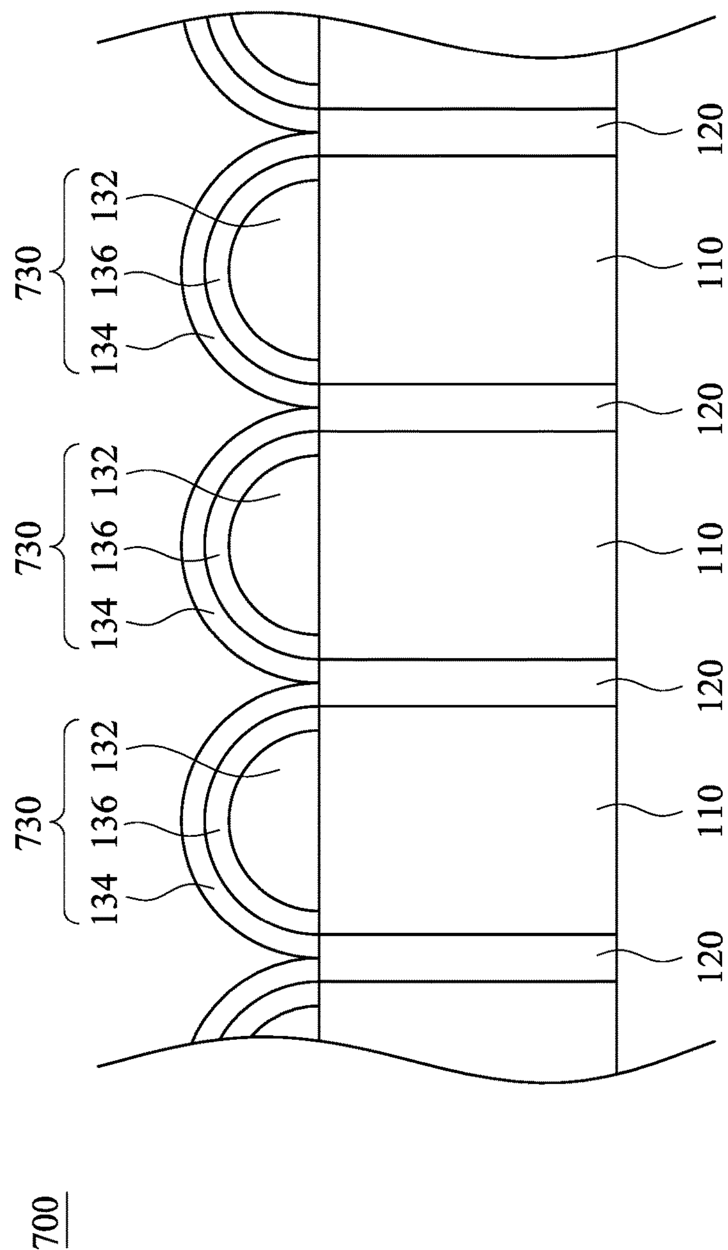
FIG. 7 is a schematic diagram showing a structure of a semiconductor device in accordance with an embodiment of the present disclosure.

Referring to FIG. 7. FIG. 7 is a schematic diagram showing a structure of a semiconductor device 700 in accordance with an embodiment of the present disclosure. The semiconductor device 700 includes the dielectric layer 110, the spacer structure 120 and lens structures 730. The spacer structure 120 is disposed in the dielectric layer 110 to define pixel regions PR in the dielectric layer 110 and the lens structures 730 are disposed on the pixel regions PR in a one-to-one manner. The spacer structure 120 is a grid to divide the dielectric layer 110 into the pixel regions PR. In this embodiment, each of the pixel regions PR is in a rectangular shape, and corresponds to one photodiode PD.

The lens structures 730 are similar to the lens structures 130, but the difference is in that the second curved lens layer 136 is located between the first curved lens layer 132 and the curved color filter layer 134, and thus the curved color filter layer 134 is located on the second curved lens layer 136. Since the curved color filter layer 134 is located on the second curved lens layer 136, a top surface of the curved color filter layer 134 is not covered by the second curved lens layer 136 and exposed to external environment. In this embodiment, the first curved lens layer 132, the curved color filter layer 134 and the second curved lens layer 136 are designed to have different refractive indexes. The first curved lens layer 132 has a first refractive index(n1), the second curved lens layer 136 has a second refractive index (n2), and the curved color filter 134 has a third refractive index(n3), and n1>n2>n3.

In some embodiments, an additional protection layer can be formed on the curved color layer 134 to protect the curved color filter layer 134, and thus the curved color filter layer 134 is located between the additional protection layer and the second curved lens layer 136 and well protected.

Figure 8:
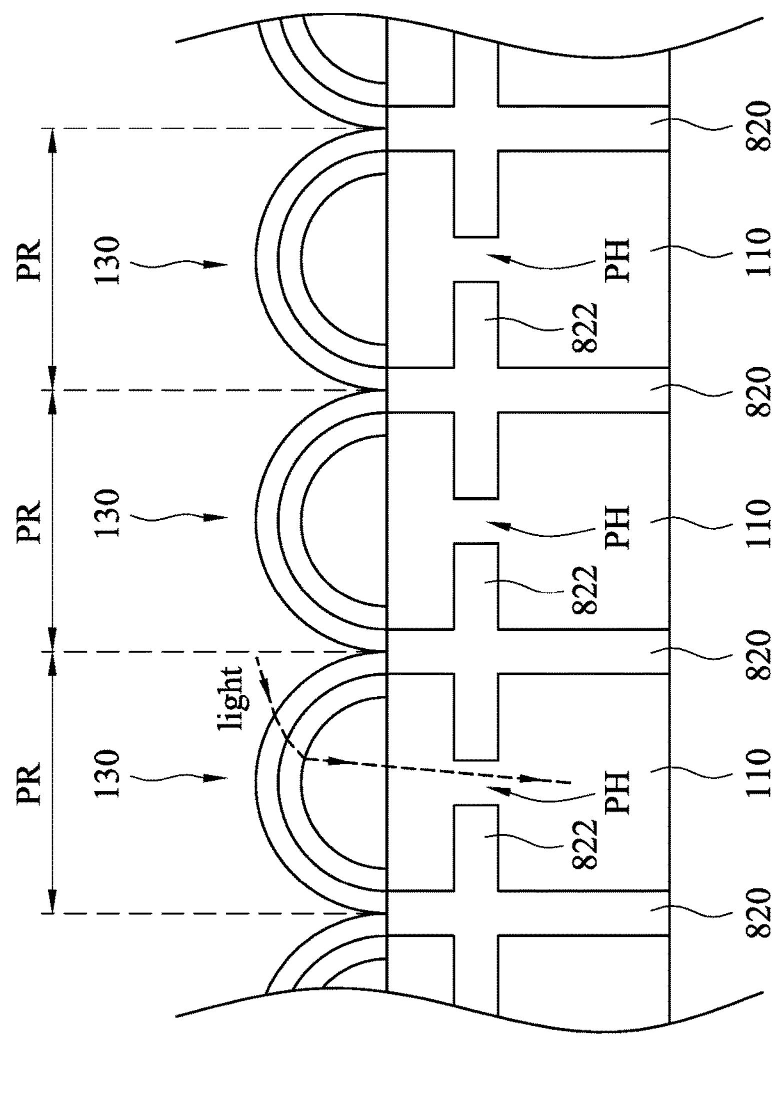
FIG. 8 is a schematic diagram showing a structure of a semiconductor device in accordance with an embodiment of the present disclosure.
Figure 9:
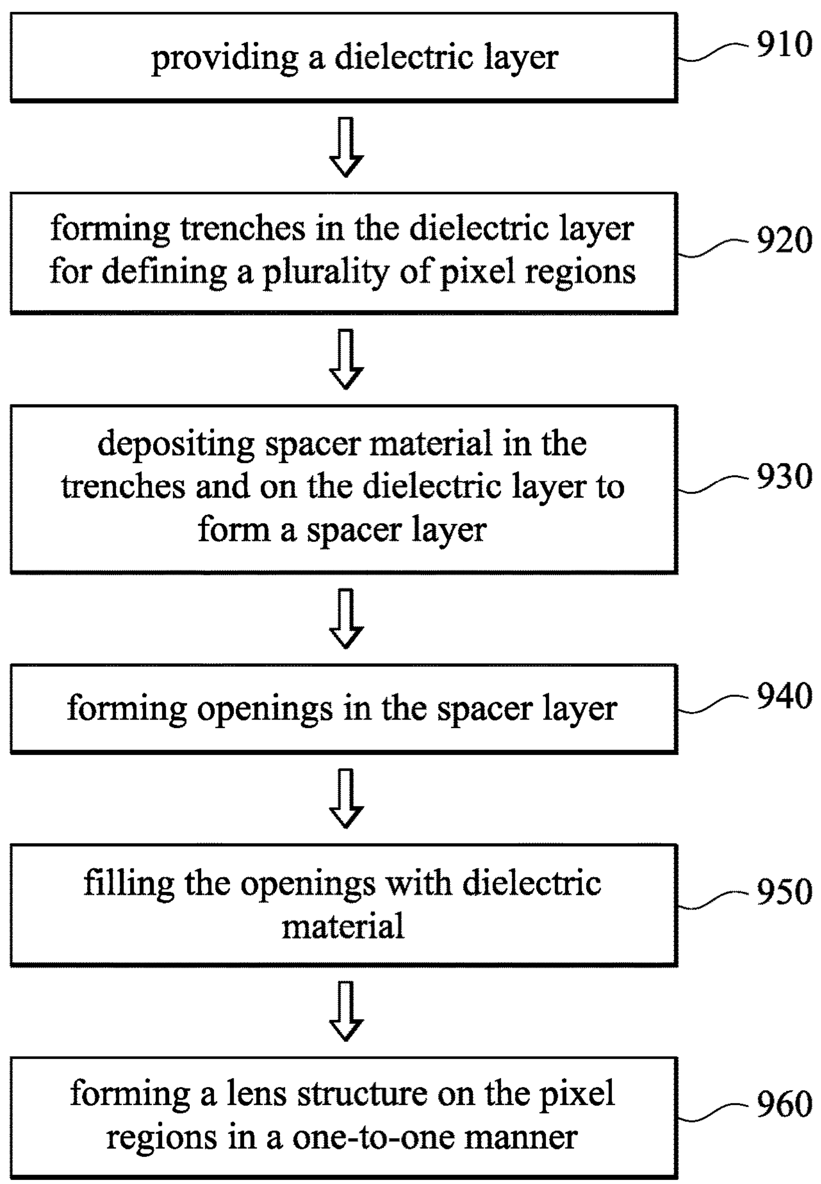
FIG. 9 is a flow chart showing a method for fabricating the semiconductor device in accordance with some embodiments of the present disclosure.

Referring to FIG. 8. FIG. 8 is a schematic diagram showing a structure of a semiconductor device 800 in accordance with an embodiment of the present disclosure. The semiconductor device 800 includes the dielectric layer 110, a spacer structure 820 and the lens structures 130. The semiconductor device 800 is similar to the semiconductor device 100, but the difference is in that the spacer structure 820 includes pinhole layers 822.

The pinhole layers 822 are disposed in the pixel regions PR in a one-to-one manner. Each of the pinhole layers 822 has a pinhole PH configured to collimate the light emitted into the lens structure 130. The pinhole PH is designed in accordance with the design of the lens structure 130. For example, when the lens structure 130 is designed to enable most of the light emitted into the dielectric layer 110 along a main light path, the pinhole PH is designed to be located on the light path for a purpose of blocking light which is not in the main light path. Since only the light along a main light path is allowed to pass through the pinhole player 822, the light emitted to the lens structure 130 is collimated. In this embodiment, the first curved lens layer 132 has a curvature radius in a range from 0.25 PS to 0.5 PS, and the pinhole PH has a size in a range from 0.1 PS to 0.9 PS, in which PS is a pixel size corresponding to each of the pixel regions PR.

To improve the performance of the collimating function of the pinhole layers 822, additional layers can be formed on the pinhole layers 822. In some embodiment, absorption layers can be formed on the pinhole players 822 to absorb the light which is not in the main light path. In some embodiments, reflection layers can be formed on the pinhole players 822 to reflect the light which is not in the main light path. In some embodiments, the pinhole layers 822 can be designed to have a curved shape. For example, each of the pinhole layers 822 are in an arc shape and a curvature radius thereof is in a range from 0.25 PS to 0.5 PS. It is noted that the curved e pinhole layers 822 are recessed towards the photodiodes under the pixel regions PR.

Further, in some embodiments, each of the pinhole layers 822 has two or more pinholes, since the lens structures 130 are designed to enable the light emitted to the lens structures 130 to have two or more main light paths.

Referring to FIG. 9 and FIG. 10 to FIG. 15, FIG. 9 is a flow chart showing a fabrication method 900 for fabricating the semiconductor device 800 in accordance with some embodiments of the present disclosure, and FIG. 10 to FIG. 15 are schematic structure diagrams of intermediate stages showing the fabrication method 900 of the semiconductor device 800 in accordance with some embodiments of the present disclosure.

Figure 10:
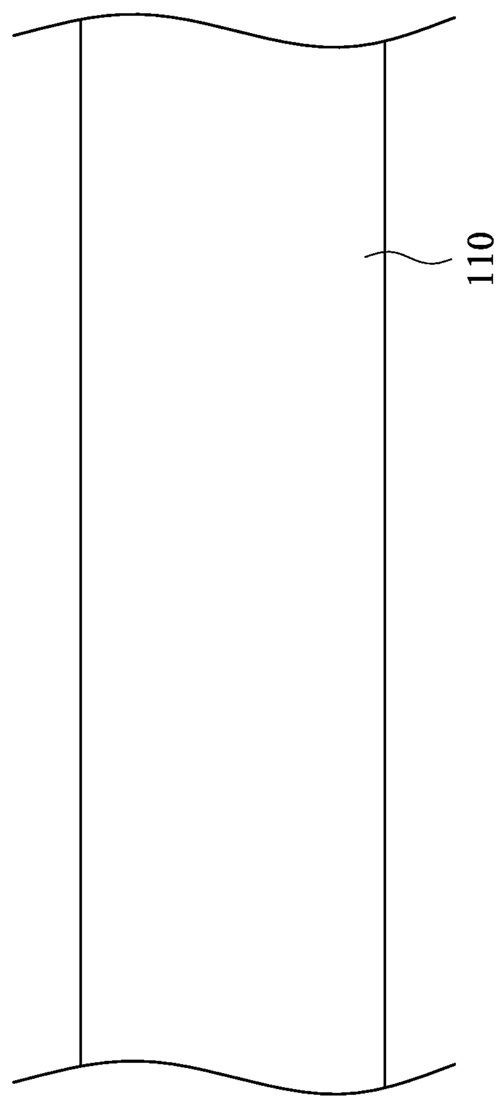
FIG. 10 to FIG. 15 are schematic structure diagrams of intermediate stages showing a method for fabricating the semiconductor device in accordance with some embodiments of the present disclosure.
Figure 11:
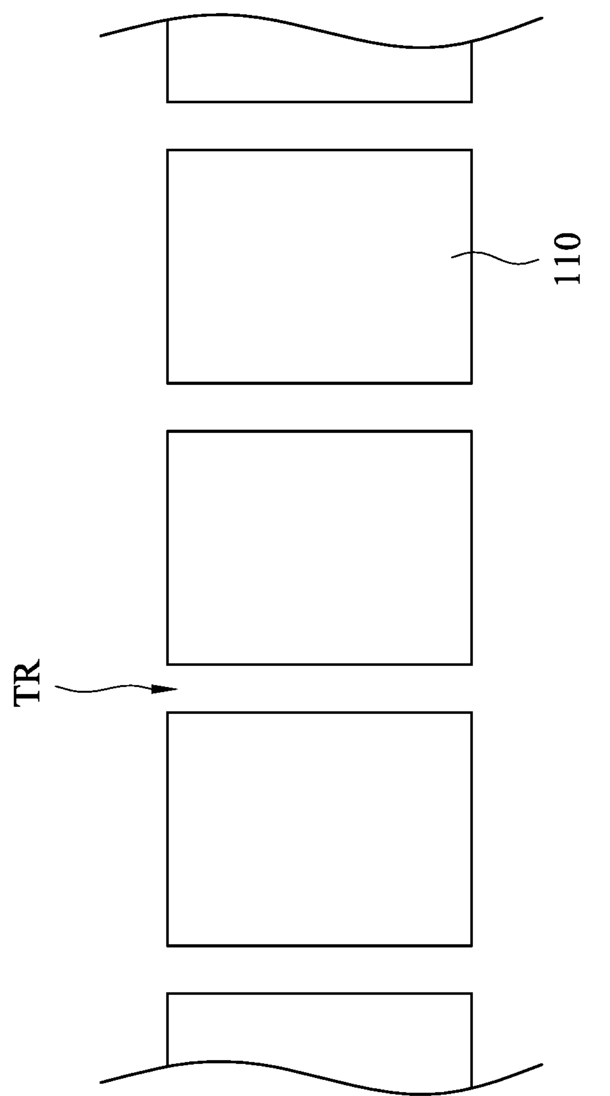

In the method 900, at first, operation 910 is performed to provide the dielectric layer 110 as show in FIG. 10. The dielectric layer 110 is a passivation layer such as silicon nitride or other suitable material, and can be formed by chemical vapor deposition (CVD), plasma enhanced CVD, sputter, and other methods known in the art. Then, operation 920 is performed to form trenches TR in the dielectric layer 110, as shown in FIG. 11. The trenches TR are in a shape of grid and can be formed by etching the dielectric layer 110. In this embodiment, the trenches TR divide the dielectric layer 110 into rectangular regions, but embodiments of the present disclosure are not limited thereto.

Figure 12:
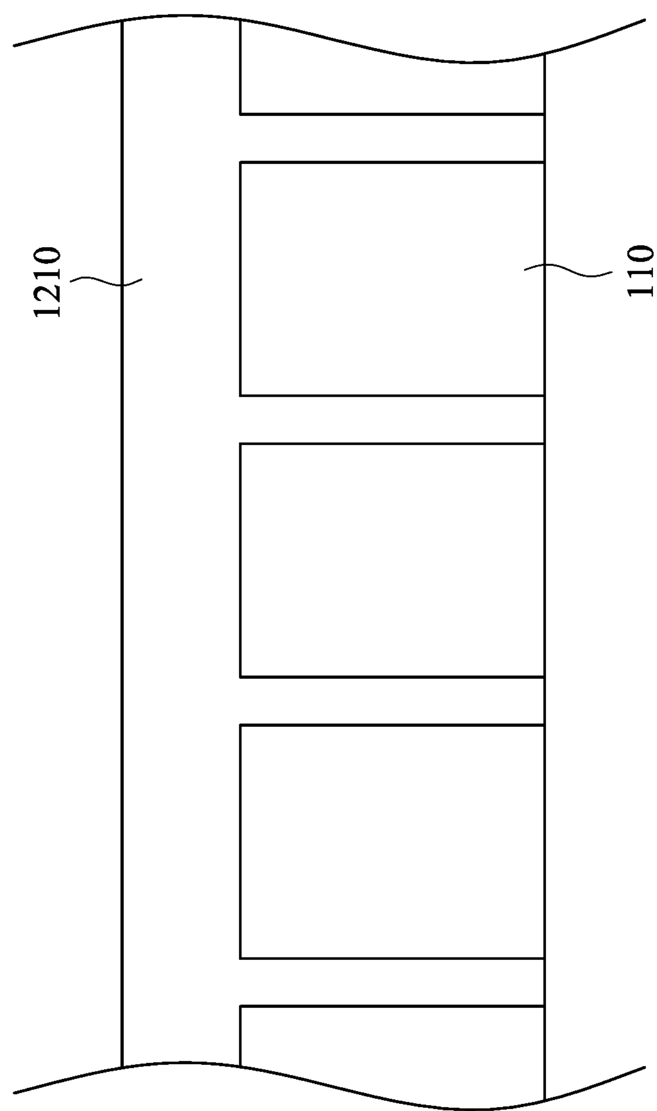

Thereafter, operation 930 is performed to fill the trenches TR with spacer material 1210 to form a portion of the spacer structure 820, as shown in FIG. 12. In the operation 930, the spacer material is not only located in the trenches TR, but also located on a surface of the dielectric layer 110. In this embodiment, the spacer material is metal, and the operation 930 can be performed by a deposition process including chemical vapor deposition (CVD), sputter deposition, or other techniques known and used in the art for depositing conductive materials. In some embodiments, the spacer material is Tungsten.

Figure 13:
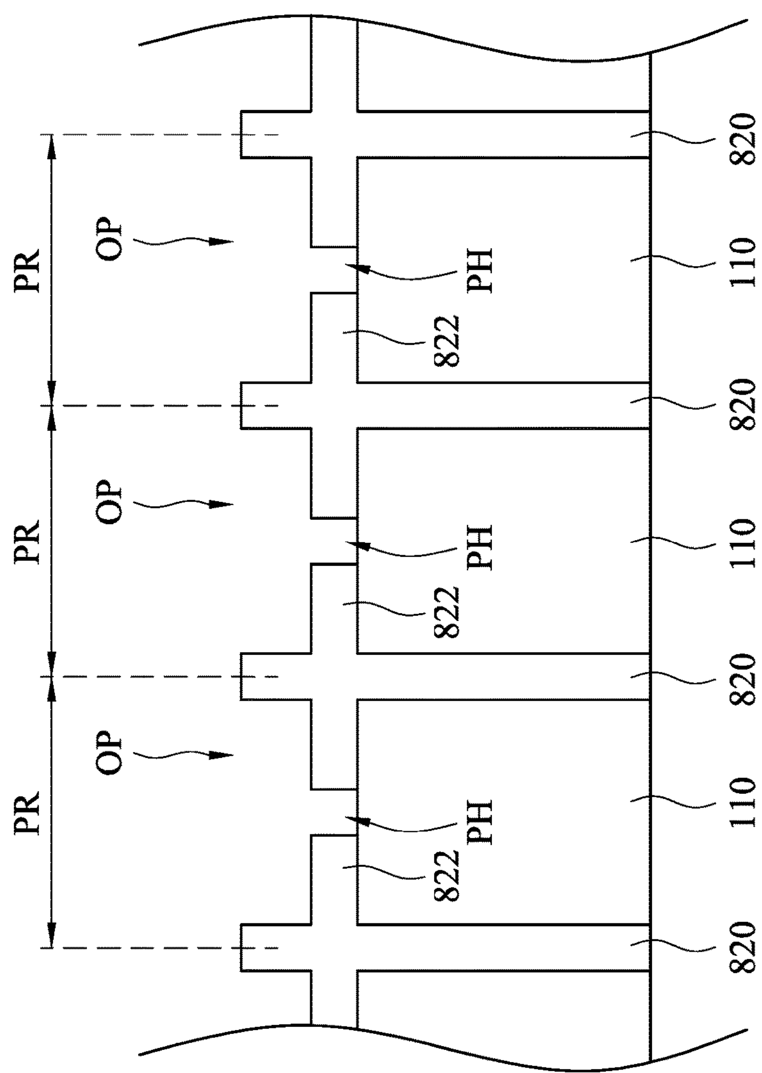

Then, operation 940 is performed to form openings OP in the spacer material 1210 to define the pixel regions PR, as shown in FIG. 13. Each of the openings OP has a wide portion and a narrow portion, and the narrow portion located under the wide portion is used as the pinhole PH. In this embodiment, the operation 940 is performed by etching the spacer material 1210 with masks.

Figure 14:
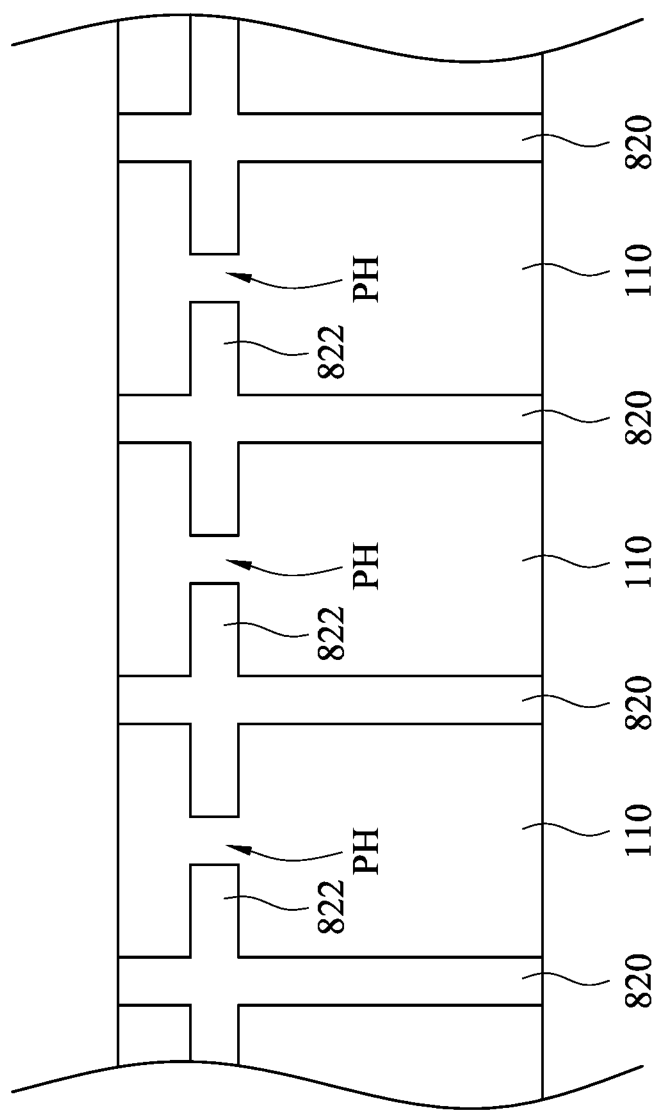

Thereafter, operation 950 is performed to fill the openings OP with dielectric material, as shown in FIG. 14. The dielectric material can be such as silicon nitride or other suitable material, and formed by chemical vapor deposition (CVD), plasma enhanced CVD, sputter, and other methods known in the art.

Figure 15:
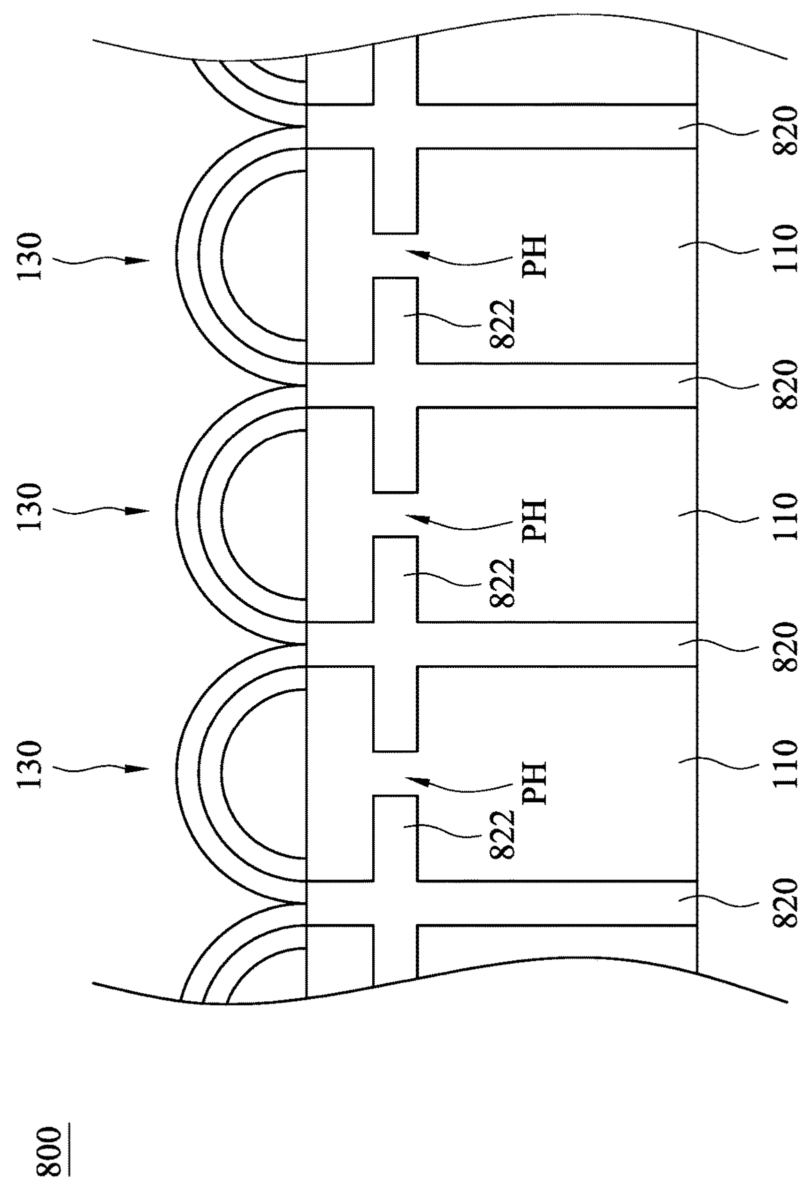

Then, operation 960 is performed to form the lens structures 130 on the pixel regions PR in a one-to-one manner, as shown in FIG. 15. In this embodiments, the first curved lens layer 132 and the second curved lens layer 136 are made by silicon nitride or silicon oxide, but embodiments of the present disclosure are not limited thereto.

It can be understood that the pinhole PH of the pinhole layer 822 provides the collimating function to collimate the light emitted to the lens structure 130. For example, the light emitted to the lens structure 130 may include light with wide incident angle, and the light with wide incident angle can be reduced by the collimating function provided by the pinhole PH of the pinhole layer 822. Further, light crosstalk can be reduced by the spacer structure 820.

Figure 16:
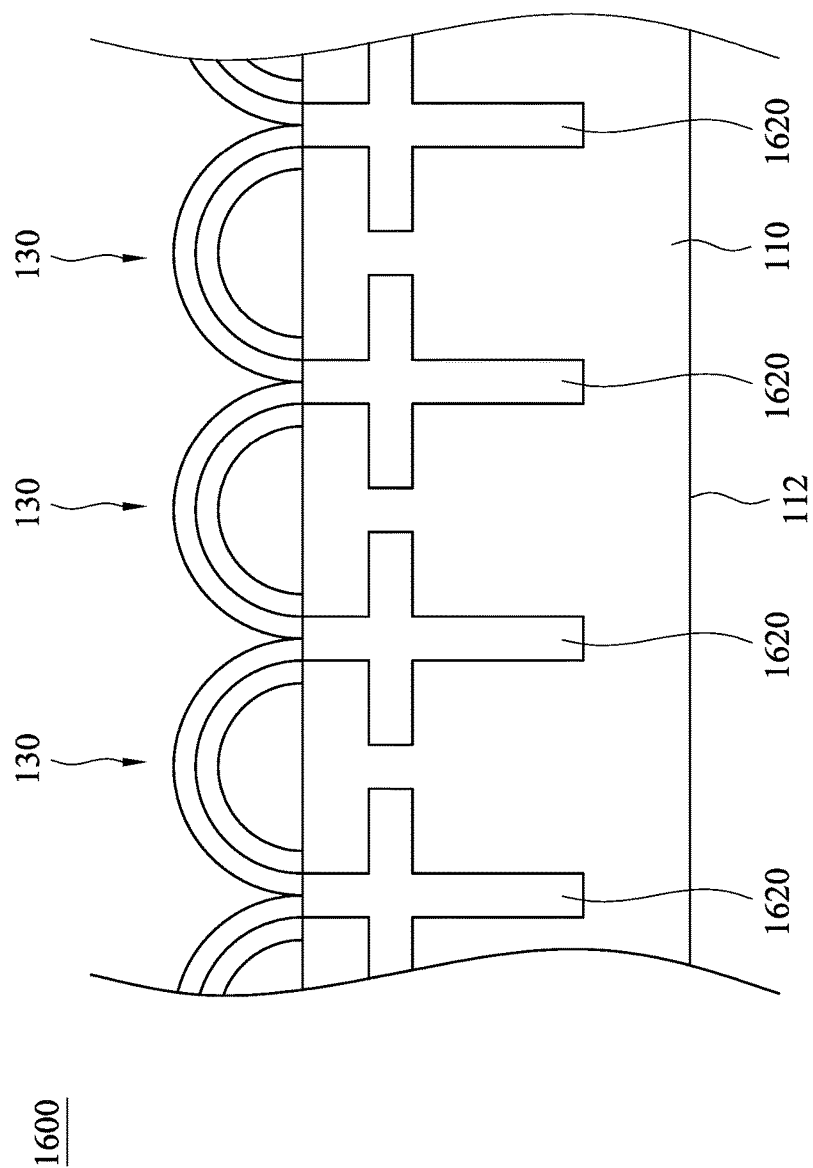
FIG. 16 is a schematic diagram showing a structure of a semiconductor device in accordance with an embodiment of the present disclosure.

Referring to FIG. 16. FIG. 16 is a schematic diagram showing a structure of a semiconductor device 1600 in accordance with an embodiment of the present disclosure. The semiconductor device 1600 includes the dielectric layer 110, a spacer structure 1620 and the lens structures 130. The semiconductor device 1600 is similar to the semiconductor device 100, but the difference is in that the spacer structure 1620 does not extend to a bottom surface of the dielectric layer 110.

Figure 17A:
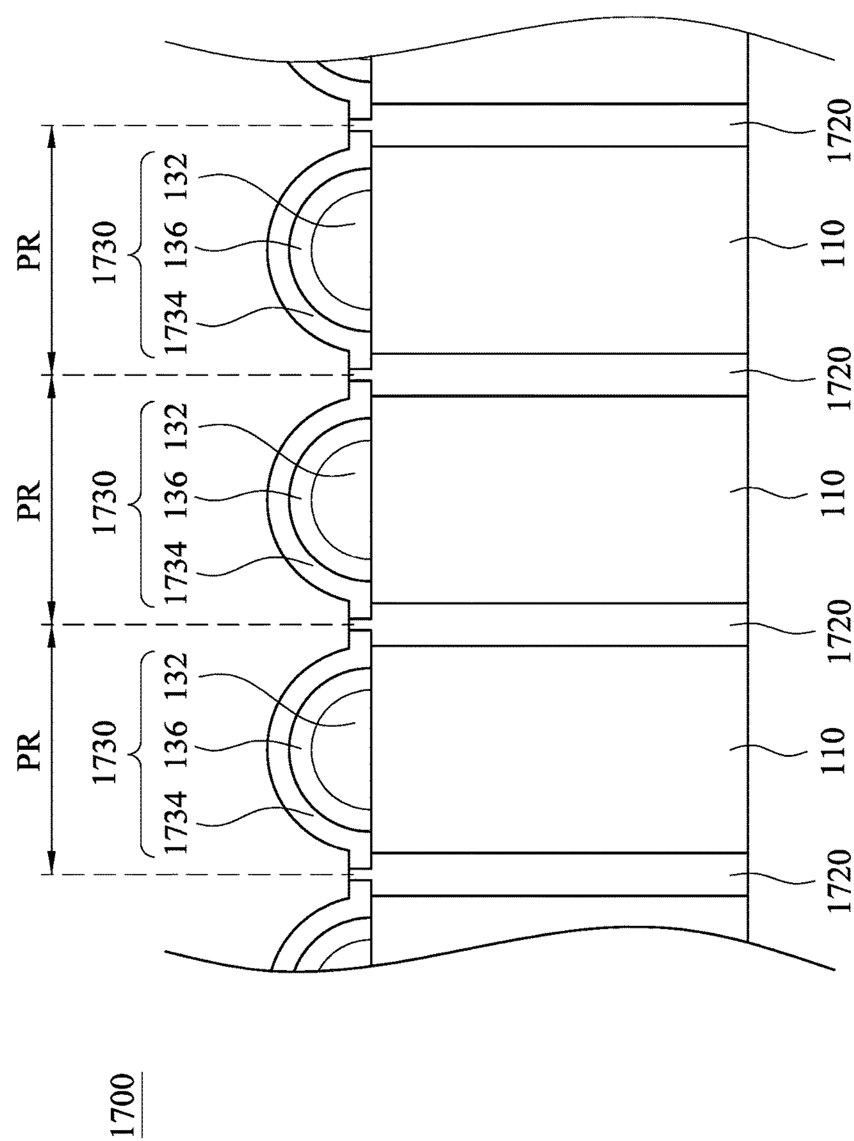
FIG. 17*a* is a schematic diagram showing a structure of a semiconductor device in accordance with an embodiment of the present disclosure.

Referring to FIG. 17*a*. FIG. 17*a* is a schematic diagram showing a structure of a semiconductor device 1700 in accordance with an embodiment of the present disclosure. The semiconductor device 1700 includes the dielectric layer 110, a spacer structure 1720 and lens structures 1730. The spacer structure 1720 is disposed in the dielectric layer 110 to define pixel regions PR in the dielectric layer 110 and the lens structures 1730 are disposed on the pixel regions PR in a one-to-one manner. The spacer structure 1720 is a grid to divide the dielectric layer 110 into the pixel regions PR.

The lens structures 1730 are configured to focus light on photodiodes under the pixel regions PR, and thus the photodiodes convert photons of the light into electrons to generate a sensed image. The lens structures 1730 are similar to the lens structure 730 shown in FIG. 7, but the difference is in that the lens structures 1730 includes a curved color filter layer 1734 in an omega shape. Further, in this embodiment, intrusion portions of the spacer structure 1720 are disposed between the curved color filter layers 1734 of adjacent two lens structures 1730 to separate the curved color filter layers 1734 of the adjacent two lens structures 1730.

Similarly, in this embodiment, the first curved lens layer 132 has a first refractive index(n1), the second curved lens layer 136 has a second refractive index(n2), and the curved color filter 1734 has a third refractive index(n3), and n1>n2>n3. Therefore, when the light emitted to the lens structures 1730, the light is sequentially refracted by the curved color filter layer 1734, the second curved lens layer 136 and the first curved lens layer 132, thereby enabling the light to be focused on the photodiode. In some embodiments, an additional protection layer can be formed on the curved color filter layer 1734 to protect the curved color filter layer 1734, and thus the curved color filter layer 134 is located between the additional protection layer and the second curved lens layer 136 and well protected.

Figure 17B:
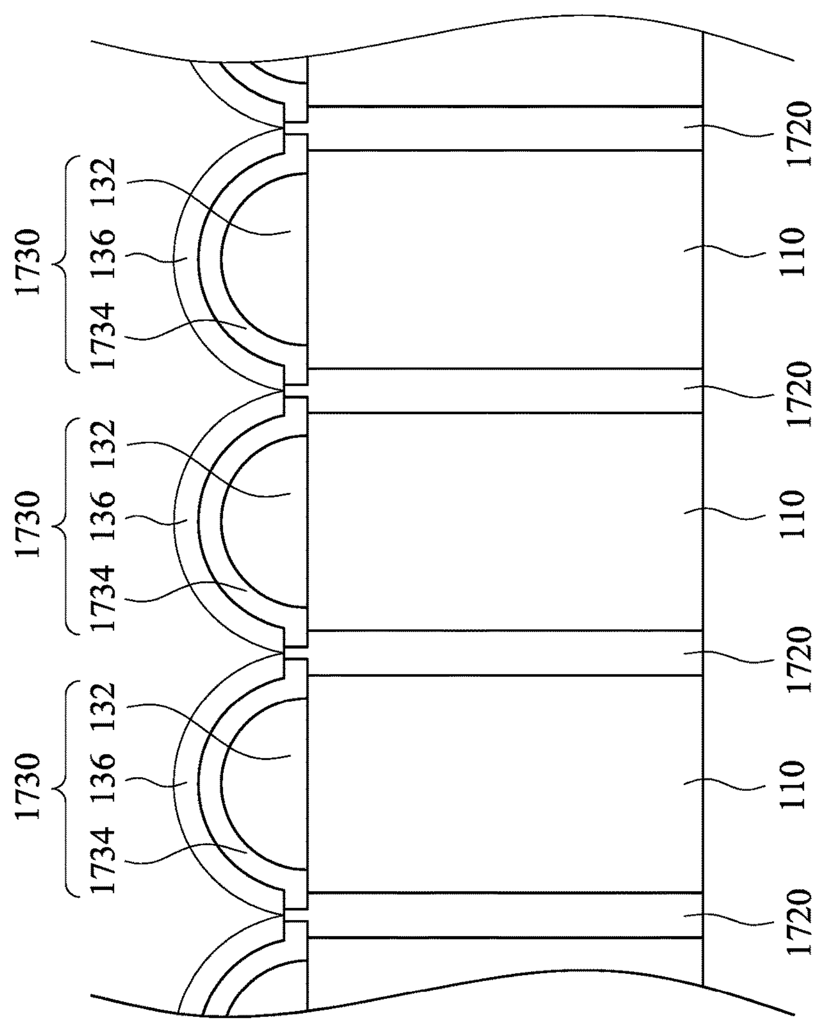
FIG. 17*b* is a schematic diagram showing a structure of a semiconductor device in accordance with an embodiment of the present disclosure.

In addition, in some embodiments, the curved color filter layer 1734 of the lens structure 1730 can be disposed between the first curved lens layer 132 and the second curved lens layer 136, as shown in FIG. 17*b*. in this case, a relationship between the first refractive index n1 of the first curved lens layer 132, the second refractive index n2 of the second curved lens layer 136 and the third refractive index n3 of the curved color filter layer 1734 is n1>n3>n2.

Figure 18:
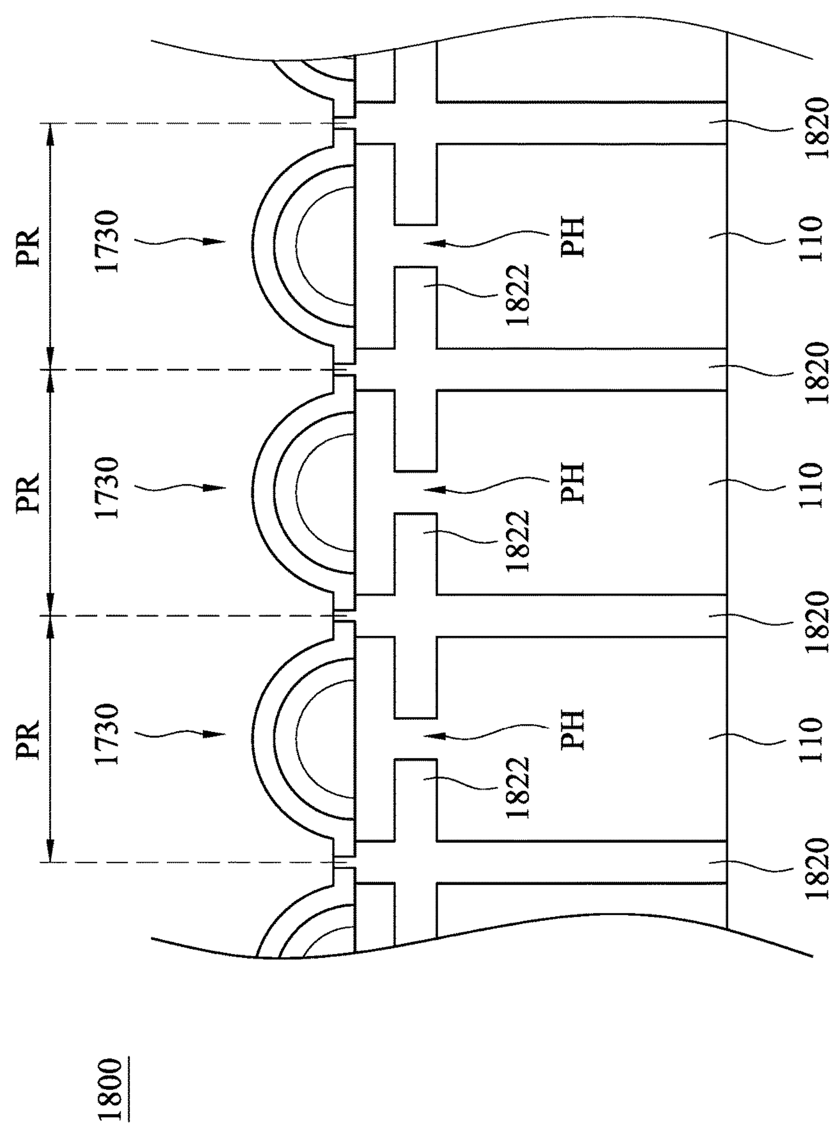
FIG. 18 is a schematic diagram showing a structure of a semiconductor device in accordance with an embodiment of the present disclosure.

Referring to FIG. 18. FIG. 18 is a schematic diagram showing a structure of a semiconductor device 1800 in accordance with an embodiment of the present disclosure.

The semiconductor device 1800 includes the dielectric layer 110, a spacer structure 1820 and the lens structures 1730. The spacer structure 1820 is similar to the spacer structure 820 of the semiconductor device 800 shown in FIG. 8. For example, the spacer structure 1820 includes pinhole layers 1822.

The pinhole layers 1822 are disposed in the pixel regions PR in a one-to-one manner. Each of the pinhole layers 1822 has a pinhole PH configured to collimate the light emitted into the lens structure 1730. The pinhole PH is designed in accordance with the design of the lens structure 1730. For example, when the lens structure 1730 is designed to enable most of the light emitted into the dielectric layer 110 along a main light path, the pinhole PH is designed to be located on the light path for a purpose of blocking light which is not in the main light path. Since only the light along a main light path is allowed to pass through the pinhole player 1822, the light emitted to the lens structure 1730 is collimated.

To improve the performance of the collimating function of the pinhole layers 1822, additional layers can be formed on the pinhole layers 1822. In some embodiment, absorption layers can be formed on the pinhole players 1822 to absorb the light which is not in the main light path. In some embodiments, reflection layers can be formed on the pinhole players 1822 to reflect the light which is not in the main light path. In some embodiments, the pinhole layers 1822 can be designed to have a curved shape. For example, each of the pinhole layers 1822 are in an arc shape and a curvature radius thereof is in a range from 0.25 PS to 0.5 PS. It is noted that the curved e pinhole layers 1822 are recessed towards the photodiodes under the pixel regions PR.

Further, in some embodiments, each of the pinhole layers 1822 has two or more pinholes, since the lens structures 1730 are designed to enable the light emitted to the lens structures 1730 to have two or more main light paths.

It can be understood that some embodiments of the present disclosure provide the lens structure having a curved color filter layer. Since the curved color filter layer is a portion of the lens structure and the curved color filter layer has a small thickness, quantum efficiency can be increased accordingly. Further, it can be understood that some embodiments of the present disclosure provide a spacer structure having pinhole layers. The pinhole layer provide light collimation function to collimate the light emitted to the lens structure, and thus light crosstalk and light with wide incident angle can be reduced.

It is noted that a geometry type of the lens structure and the pinhole layer is not limited to the above embodiments of present disclosure. The lens structure can be in a rectangle, triangle or other geometry type. Similarly, the pinhole layer can be in a rectangle, triangle or other geometry type.

In accordance with an embodiment of the present disclosure, the present disclosure discloses a lens structure configured to focus light on a photodiode. The semiconductor device includes a first curved lens layer, a second curved lens layer and a curved color filter layer. Regarding the first curved lens layer, the light enters the first curved lens layer from an upper surface of the first curved lens layer and exits from a lower surface of the first curved lens layer. The second curved lens layer is disposed on the upper surface of the first curved lens layer. The curved color filter layer is disposed on the second curved lens layer or between the first curved lens layer and the second curved lens layer.

In accordance with another embodiment of the present disclosure, the present disclosure discloses a semiconductor device configured to focus light on photodiodes. The semiconductor device includes a dielectric layer, a spacer structure and lens structures. The spacer structure is disposed in the dielectric layer to define pixel regions in the dielectric layer. The lens structures are disposed on the pixel regions in a one-to-one manner to focus light on the photodiodes. Each of the lens structure includes a first curved lens layer, a second curved lens layer and a curved color filter layer. Regarding the first curved lens layer, the light enters the first curved lens layer from an upper surface of the first curved lens layer and exits from a lower surface of the first curved lens layer. The second curved lens layer is disposed on the upper surface of the first curved lens layer. The curved color filter layer is disposed on the second curved lens layer or between the first curved lens layer and the second curved lens layer.

In accordance with another embodiment of the present disclosure, the present disclosure discloses a method for fabricating a semiconductor device. In the fabrication method, at first, a dielectric layer is provided. Then, trenches are formed in the dielectric layer. Thereafter, the trenches are filled with spacer material to form a spacer structure in the dielectric layer for defining pixel regions in the dielectric layer. Then, lens structures are formed on the pixel regions in a one-to-one manner. Each of the lens structures includes a first curved lens layer, a second curved lens layer and a curved color filter layer. Regarding the first curved lens layer, the light enters the first curved lens layer from an upper surface of the first curved lens layer and exits from a lower surface of the first curved lens layer. The second curved lens layer is disposed on the upper surface of the first curved lens layer. The curved color filter layer is disposed on the second curved lens layer or between the first curved lens layer and the second curved lens layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A lens structure configured to focus light on a photodiode, the lens structure comprising:

a first curved lens layer having a first upper curved surface and a first lower surface opposite to the first upper curved surface;

a second curved lens layer disposed on the first upper curved surface of the first curved lens layer, wherein the second curved lens layer has a second upper curved surface and a second lower curved surface opposite to the second upper curved surface; and a curved color filter layer disposed between the first curved lens layer and the second curved lens layer, wherein the curved color filter layer has a third upper curved surface and a third lower curved surface opposite to the third upper curved surface.

2. The lens structure of claim 1, wherein the first curved lens layer is in a semi-circular shape, and the second curved lens layer and the curved color filter layer are in an arc shape.

3. The lens structure of claim 1, wherein the curved color filter layer is in an omega shape.

4. The lens structure of claim 1, wherein the first curved lens layer has a first refractive index(n1), the second curved lens layer has a second refractive index(n2), the curved color filter layer has a third refractive index(n3), and nl>n3>n2.

5. The lens structure of claim 1, wherein the first curved lens layer and the second curved lens layer are made by silicon nitride or silicon oxide.

6. The lens structure of claim 1, wherein a thickness of the curved color filter layer is in a range from 0.01 to 0.5 micrometer (um).

7. A semiconductor device, comprising:

a dielectric layer;

a spacer structure disposed in the dielectric layer to define a plurality of pixel regions in the dielectric layer; and a plurality of lens structures disposed on the pixel regions in a one-to-one manner to focus light on a photodiode, wherein each of the lens structures comprises:

a first curved lens layer having a first upper curved surface and a first lower surface opposite to the first upper curved surface;

a second curved lens layer disposed on the first upper curved surface of the first curved lens layer, wherein the second curved lens layer has a second upper curved surface and a second lower curved surface opposite to the second upper curved surface; and a curved color filter layer disposed between the first curved lens layer and the second curved lens layer, wherein the curved color filter layer has a third upper curved surface and a third lower curved surface opposite to the third upper curved surface.

8. The semiconductor device of claim 7, wherein the spacer structure includes a plurality of pinhole layers formed in the pixel regions in a one-to-one manner, and each of the pinhole layers has at least one pinhole configured to collimate the light.

9. The semiconductor device of claim 8, wherein the at least one pinhole has a size which is in a range from 0.1PS (Pixel Size) to 0.9PS, wherein PS is a pixel size corresponding to each of the pixel regions.

10. The semiconductor device of claim 7, wherein the first curved lens layer has a curvature radius which is in a range from 0.25PS to 0.5PS, wherein PS is a pixel size corresponding to each of the pixel regions.

11. The semiconductor device of claim 7, wherein the curved color filter layer is in an omega shape.

12. The semiconductor device of claim 7, wherein a thickness of the curved color filter layer is in a range from 0.01 to 0.5 um.

13. The semiconductor device of claim 7, wherein the spacer structure comprises metal.

14. The semiconductor device of claim 13, wherein the metal is Tungsten.

15. The semiconductor device of claim 7, wherein the curved color filter layer is in contact with the second curved lens layer.

16. The semiconductor device of claim 7, wherein the first lower surface is substantially flat.

17. The semiconductor device of claim 7, wherein the third upper curved surface is a convex surface.

18. A semiconductor device, comprising:

a plurality of photodiodes;

a dielectric layer disposed on the photodiodes;

a spacer structure disposed in the dielectric layer to define a plurality of pixel regions in the dielectric layer; and a plurality of lens structures disposed on the pixel regions in a one-to-one manner to focus light on the photodiodes, wherein the dielectric layer is located between the photodiodes and the lens structures, and each of the lens structures comprises:

a first curved lens layer having a first upper curved surface and a first lower surface opposite to the first upper curved surface;

a second curved lens layer disposed on the first upper curved surface of the first curved lens layer, wherein the second curved lens layer has a second upper curved surface and a second lower curved surface opposite to the second upper curved surface; and a curved color filter layer disposed between the first curved lens layer and the second curved lens layer, wherein the curved color filter layer has a third upper curved surface and a third lower curved surface opposite to the third upper curved surface.

19. The semiconductor device of claim 18, wherein the first curved lens layer is in a semi-circular shape, the second curved lens layer and the curved color filter layer are in an arc shape.

20. The semiconductor device of claim 18, wherein the curved color filter layer is in an omega shape.

* * * * *